United States Patent [19]

Monsees

[11] Patent Number: 4,687,702
[45] Date of Patent: Aug. 18, 1987

[54] STRUCTURAL INSULATING PANEL AND METHOD OF MAKING THE PANEL

[75] Inventor: John C. Monsees, El Cajon, Calif.

[73] Assignee: Chemtronics, El Cajon, Calif.

[21] Appl. No.: 877,006

[22] Filed: Jun. 20, 1986

[51] Int. Cl.$^4$ ............ B32B 5/14; B32B 3/26; B32B 15/08; B05D 3/02

[52] U.S. Cl. .................... 428/308.4; 427/229; 427/252; 428/313.5; 428/319.1; 428/458; 428/473.5

[58] Field of Search ............... 428/313.5, 306.6, 307.3, 428/307.7, 308.4, 313.3, 319.1, 458, 473.5; 427/229, 252

[56] References Cited

U.S. PATENT DOCUMENTS 3,446,906  5/1969  Zulauf ..................... 427/252
4,521,475  6/1985  Riccio et al. ............... 428/142
4,568,603  2/1986  Oldham ..................... 428/313.5

Primary Examiner—William J. Van Balen
Attorney, Agent, or Firm—Frank D. Gilliam

[57] ABSTRACT

A structural panel having superior insulating properties which comprises a sheet of polyimide foam material having a metal layer on at least one surface, the metal layer being diffused into the foam structure, providing a superior metal-to-foam bond. The polyimide foam has excellent insulating and structural properties and is highly resistant to high temperatures and open flames. The metal layer adds considerable structural strength, since the diffusion of metal into the foam produces a three-dimensional metal structure rather than the usual planar surface film. The metal layer is applied to the foam sheet by chemical vapor deposition under conditions which improve the diffusion of the metal into the foam.

16 Claims, 3 Drawing Figures

4,687,702

STRUCTURAL INSULATING PANEL AND METHOD OF MAKING THE PANEL

BACKGROUND OF THE INVENTION

This invention relates in general to structural panels and, more specifically, to a metal-surfaced polyimide foam structural panel in which the metal layer is diffused into interstices or discontinuities in the foam surface.

Metal surface layers have been applied to a very large variety of substrates. Typically, metals have been applied by electroless plating, electroforming, flame spraying, sputtering, plasma deposition and by simply bonding a metal film or foil to a substrate with an adhesive. While these techniques have generally produced acceptable results for many applications, when a composite panel produced by these methods is used in structural applications, problems of peeling of the metal layer from the substrate often occurs. Also, the metal is present only as a planar, parallel-surfaced, film and adds little to the structural strength of the panel. Further, these techniques have been less successful where the substrate is a foam material. Bonding to foam surfaces hav been found to be especially difficult, with low peel strength often resulting. Also, many of these application methods use temperatures or other conditions which tend to damage many insulating foam materials.

Attempts have been made to apply a metal surface layer to solid plastics or other substrates by chemical vapor deposition, such as is described by Popley in U.S. Pat. No. 3,519,473. Unfortunately, the coatings produced by these teachings do not have the desired adhesive strength since it is dependent upon simple adhesion. Ideally, where the composite structure is subject to stress causing catastrophic failure, the structure should fail by destruction of the substrate rather than failure along the metal-to-substrate bond line.

Complex techniques, such as the multi-layer, multi-metal, method described by Corwin in U.S. Pat. No. 3,537,881, have been used in an attempt to improve bonding. While some improvement results, peel strength is still not as great as is desirable. Attempts have been made to inter-lock sequential layers together, such as by using a layer of glass fibers extending both into a substrate and into a plastic surface coating, as detailed by El Bouhnini et al. in U.S. Pat. No. 4,242,406. This requires a complex and cumbersome mold and method in which the substrate and coating are produced at substantially the same time. This is not applicable to forming a metal coating or layer on a pre-existing substrate which may be highly contoured from previous shaping or re-shaping operations.

Thus, there is a continuing need for improved structural insulating panels having high insulating properties with a well-bonded metal surface layer and for methods of making such panels.

SUMMARY OF THE INVENTION

The above-noted problems, and others, are overcome by a method of making structural insulating panels which basically comprises providing a sheet of polyimide foam material and applying thereto a metal layer by chemical vapor deposition. Such foam structures, even when closed-cell, have natural microporosity in the surface. The resulting panel is found to have the metal diffused into the foam surface, forming a three-dimensional structure of metal and foam near the foam surface. Typically, the surface layer is 100% metal, generally having a thickness in accordance with desired structural properties. Metal penetrates to a depth corresponding to the density and porosity of the foam structure.

BRIEF DESCRIPTION OF THE DRAWING

Details of the invention, and of preferred embodiments thereof, will be further understood upon reference to the drawing, wherein.

DETAILED DESCRIPTION OF THE INVENTION

Figure 1:
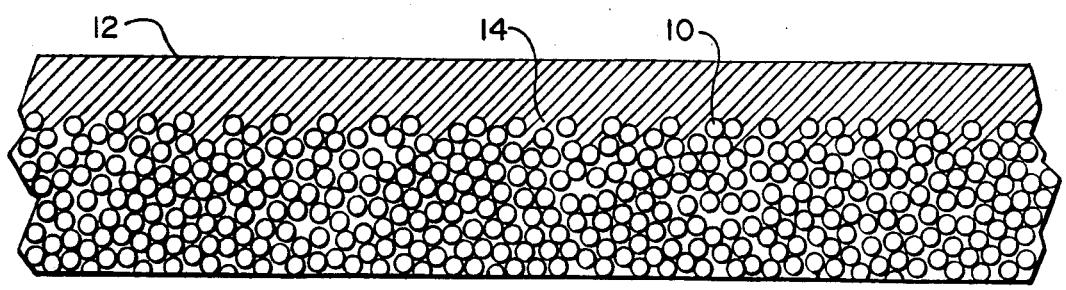
FIG. 1 is a section through a structural insulating panel according to this invention, the section taken perpendicular to the panel face.

Referring now to FIG. 1, there is seen a polyimide foam sheet 10, here a sheet of bonded polyimide microballoons, having on one surface a smooth, continuous layer of metal 12. While diffusion of metal into the foam structure is difficult to illustrate, the metal layer 10 can be seen to have diffused into interstices between adjacent but slightly out of contact microballoons, such as at 14. These interstices are very small, often in the submicron range and should constitute at least about 1% of the foam surface.

Any suitable polyimide foam may be used to form sheet 10 which has the necessary surface openings to permit diffusion of the metal into the foam during deposition of layer 12. Typically, the foam sheet 10 may be an open-cell foam or may be a closed cell foam having the necessary interstices or surface discontinuities, such as are present in foam produce by bonding polyimide microballoons together. Typical polyimide foams may be produced by the methods described in U.S. Pat. Nos. 4,407,980; 4,394,464; 4,426,463; 4,425,441; 4,433,068 and 4,476,254.

Layer 12 may be formed from any suitable metal which plates out at a temperature below the decomposition temperature of the foam substrate. Typical metals include nickel, copper, and mixtures or alloys thereof. Metal layer 12 may be deposited to any suitable thickness. Typically, thicknesses in the 0.001 to 0.5 inch range are useful, with thickness of from about 0.015 to 0.125 inch giving good results. Best results are obtained with a nickel layer having a thickness of about 0.06 inch. The degree of diffusion of the metal into the foam surface depends in part on the deposition method used and on the number and size of foam sheet surface interstices. Typically, the metal may penetrate to produce a region of 50 volume percent metal and 50 volume percent foam at a depth below the foam surface of from about 0.03 to 0.50 inch. Excellent results are achieved with the 50% layer being at a depth below the foam surface of about 0.125 to 0.250 inch. For best structural bonding, a penetration depth (to the 50/50 volume ratio) should be about 25% to 30% of the overall panel thickness.

Figure 2:
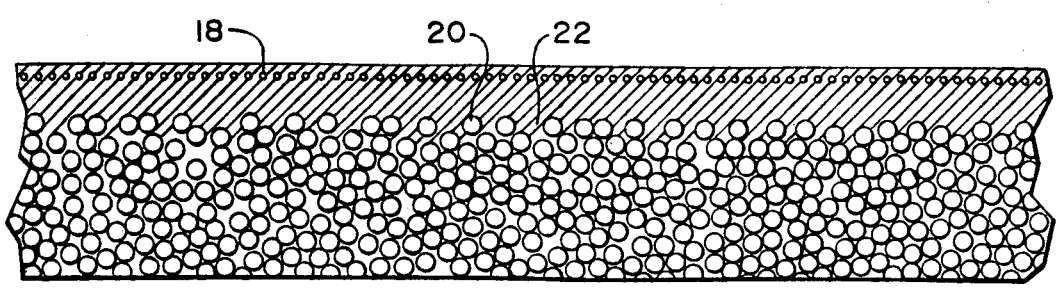
FIG. 2 is a section through a second embodiment of my structural insulating panel, taken perpendicular to the panel surface.

An alternate embodiment of the structural insulating panel is shown in FIG. 2. There, a layer of woven or matt fiberous material 18 (such as glass, polyimide, carbon, plastic or other suitable material) is laid over the surface of foam sheet 20 which is generally similar to foam sheet 10 of FIG. 1. When metal 22 is deposited on the panel, the metal atoms fill the spaces between the fibers of sheet 18 and the surface of foam sheet 20 (these spaces being somewhat exaggerated for clarity of illustration) and penetrate into interstices in the surface of foam sheet 20. The result is a composite having the fiber material imbedded in the metal layer which is structurally bonded to foam 20.

Figure 3:
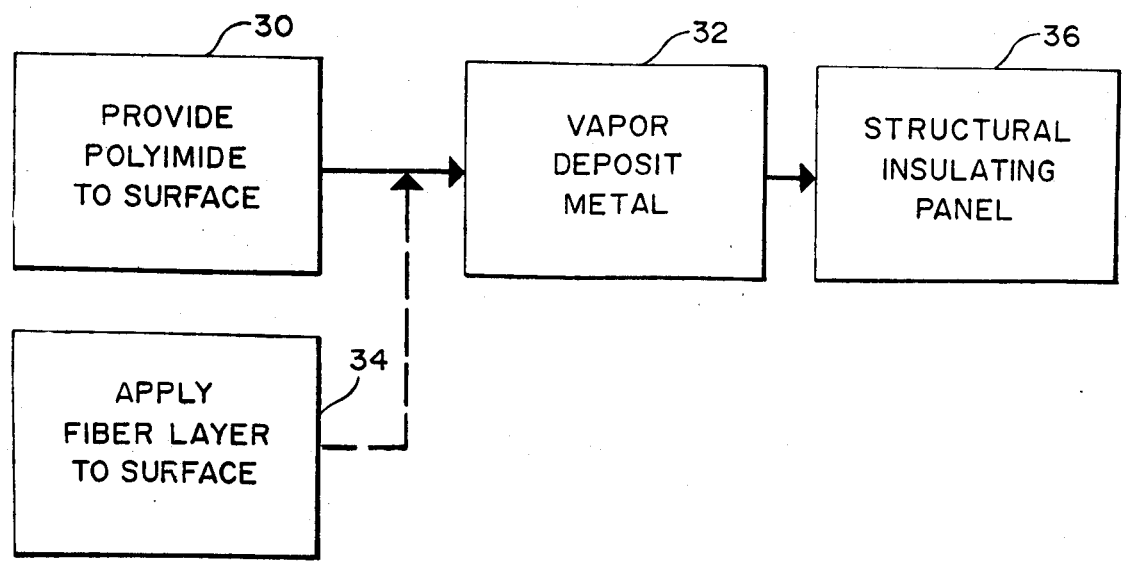
FIG. 3 is a block flow diagram illustrating the method of my invention.

The method of preparing my structural insulating panels is schematically illustrated in FIG. 3. Initially, a sheet of suitable polyimide foam is prepared or otherwise provided, as indicated at 30. As described above, any suitable foam sheet having the necessary surface discontinuities or interstices may be used. Then, the metal layer is applied by chemical vapor deposition, as indicated at 32. If desired, a layer of fiberous fabric or matt may be placed over the surface of the foam sheet before the metal is deposited, as indicated at 34. If desired, a metal layer may be applied to both opposite surface (or all surfaces) of the foam sheet, any or all of which may bear a fiber sheet. Once the chemical vapor deposition of the metal is complete, the structural insulating panel is finished, as indicated at 36.

In a preferred method, the foam sheet is placed in the vacuum chamber which is then heated to a temperature below the degradation temperature of the foam while a slight vacuum, typically 1 to 10 torr, is applied slowly over about 10 to 60 minutes to allow any residual gases in the foam to escape. Typically the temperature may be relatively high, in the 200 to 280° C. range, since polyimides are very resistant to high temperature degradation. The chamber is then purged by flowing an inert gas, such as argon, therethrough. A gas or vapor which will, upon heating, decompose to produce an elemental metal (such as nickel carbonyl to produce nickel or any other conventional vapor deposition gas to produce any other selected elemental metal, or a mixture of gases to produce an alloy), is admitted to the chamber. The chamber is then heated to the decomposition temperature of the gas whereupon the elemental metal is plated on and into the foam surface. The gas or vapor may be held in the chamber prior to heating for a short (e.g., 1 to 10 minutes) period under slight pressure, such as about 20 to 40 mm of mercury, to allow the gas to "soak" into the surface interstices, which appears to aid in plating deeply into the interstices. After a sufficient period to produce a metal layer of the desired thickness (typically 60 to 300 minutes) the residual gas is removed and the plated foam sheet is removed from the chamber.

This panel may be used in building construction as a combined structural and insulating panel which also has outstanding high temperature and fire resistance, emitting no toxic gases when exposed to open flame. The metal layer serves as a heat reflector and vapor barrier and, because of the firm three-dimensional bond to the foam, greatly improves the structural strength of the panel.

The metal may be deposited by any suitable chemical vapor deposition method. Typical methods for the chemical vapor deposition of metals are described in U.S. Pat. Nos. 3,519,473 and 3,537,881 and in Chemical Engineering, Vol. 546, No. 10 (1949).

The following examples further detail certain preferred embodiments of methods of making my novel structural insulating panels. All parts and percentages are by weight unless otherwise indicated.

EXAMPLE I

A 12 by 12 inch sheet of polyimide foam having a thickness of about 0.5 inch is prepared by the process described in U.S. Pat. No. 4,407,980. The foam is a low density foam in which "macroballoons" or very small substantially spherical foam particles produced by expanding polyimide precursor particles are bonded together in a manner permitting surface discontinuities or interstices amounting to about 10% of the surface area. This sheet is placed inside a vacuum chamber which is tightly closed. The chamber is then evacuated by a vacuum pump to a slight vacuum, about 5 torr, very slowly to permit gasses in the foam to diffuse away. The chamber is maintained at about 260° C. for about 30 minutes. Argon gas is then admitted to the chamber to a pressure slightly above atmospheric. The temperature is lowered to about 90° C. and the argon is allowed to flow through the chamber to purge the chamber of other gases for about 10 minutes. Nickel carbonyl vapor is admitted into the chamber to a pressure of about 30 mm of mercury while the argon gas is allowed to pass from the chamber. At this point the nickel carbonyl begins to soak into the foam structure interstices. The chamber temperature is increased to about 195° C. The nickel carbonyl decomposes, producing atomic nickel and carbon monoxide. The nickel begins to coat the foam sheet surface. Areas of the apparatus not to be coated are protected by a thin layer of vacuum grease. After about 240 minutes the system is pumped down to remove residual gases, air is admitted and the chamber is opened. A dull nickel coating is found on the foam surface. Attempts to peel the nickel coating from the foam result in tearing of the foam below the surface. Close examination shows the nickel to have penetrated well into the foam interstices and to be very tightly adhered and mechanically bonded to the foam.

EXAMPLE II

The experiment of Example I is repeated, except that the foam sheet is suspended on several pins in the chamber. All exposed surfaces of the foam are found to have received a firmly adherent nickel coating.

EXAMPLE III

The experiment of Example I is repeated, except that a thin sheet of open weave glass fiber cloth is placed on the foam surface and position is continued for about 3 hours. A dull nickel coating is found to cover the fabric and foam surfaces, bonding them together and to the foam surface.

While the above examples, which describe preferred embodiments of the method and panel of this invention, describe in detail certain process variables and parameters, these may be varied, where suitable, with similar results. For example, the foam can contain any suitable additives, such as fillers, reinforcements and surfactants and other metals and surface reinforcing fabrics may be used.

Other variations, applications and ramifications of this invention will occur to those skilled in the art upon reading this disclosure. Those are intended to be included within the scope of this invention, as defined by the appended claims.

I claim:
1. A structural insulating panel comprising:
   a polyimide foam sheet having surface discontinuities or interstices extending into the foam surface and constituting at least about 1 percent of the foam surface area; and a layer of metal on at least one foam surface having a substantially planar outer surface and extending into said discontinuities and interstices with the area in a plane parallel to the foam surface at a depth of from about 0.03 to 0.50 inch being substantially 50% metal and 50% polyimide;

whereby said metal layer is very firmly adhesively and mechanically bonded to said foam and has a three-dimensional structure within the foam providing improved structural strength.

2. The panel according to claim 1 wherein said metal is nickel or an alloy having nickel as the primary constituent.

3. The panel according to claim 1 wherein said metal layer has an average thickness of from about 0.015 to 0.125 inch.

4. The panel according to claim 1 wherein said metal layer consists essentially of nickel and has an average thickness of about 0.06 inch.

5. The panel according to claim 1 wherein said 50 percent metal, 50 percent polyimide, layer lies at a depth of from about 0.125 to 0.250 inch below the foam surface.

6. The panel according to claim 1 further including a layer of fibrous material in contact with said surface of said foam and embedded within said metal layer.

7. The panel according to claim 1 wherein the thicknesses of said foam sheet and said metal layer are selected so as to give an average metal layer thickness of about 25 to 30 percent of the panel thickness.

8. The method of making a structural insulating panel which comprises the steps of:

providing a foam sheet having at least one surface with discontinuities and interstices extending into the foam surface, said discontinuities and interstices covering at least about 1 percent of the foam surface area;

placing said foam sheet into a vacuum chamber and closing said chamber;

reducing the pressure in said chamber;

purging said chamber of air and other reactive gases;

introducing into said chamber at least one gas capable of decomposition to produce at least one elemental metal;

heating said chamber to a temperature above the decomposition temperature of said gas but below the degradation temperature of said foam;

allowing said metal to deposit on said foam surface and diffuse into said interstices and discontinuities until the area in a plane parallel to the foam surface at a depth of from about 0.03 to 0.5 inch is substantially 50% metal and 50% resin;

continuing said deposition until a metal layer having an average thickness of from about 0.001 to 0.5 inch results; and removing said sheet from said chamber;

whereby a metal layer is formed on the foam surface having a substantially planar outer surface and an inner surface extending into said discontinuites and interstices so that the metal layer is firmly mechanically bonded to said foam sheet.

9. The method according to claim 8 wherein said metal is predominantly nickel.

10. The method according to claim 8 wherein said gas is primarily nickel carbonyl.

11. The method according to claim 8 wherein said metal layer is formed to an average thickness of from about 0.015 to 0.125 inch.

12. The method according to claim 8 wherein said metal layer is predominantly nickel and is formed to an average thickness of about 0.06 inch.

13. The method according to claim 8 wherein the thicknesses of said foam sheet and said metal layer are selected so as to give an average metal layer thickness of about 25 to 30 percent of the panel thickness.

14. The method according to claim 8 further including the steps of laying a sheet of fiberous material on said foam surface prior to closing said chamber and of continuing metal deposition until said fiberous sheet is embedded in said metal layer.

15. The method according to claim 8 further including the step of heating said chamber to a temperature of from about 200° to 280° C. for about 10 to 60 minutes prior to introducing said gas.

16. The method according to claim 8 further including the step of purging said chamber with an inert gas prior to introducing said gas.

* * * * *